United States Patent [19]

Hong

[11] Patent Number: 5,635,749
[45] Date of Patent: Jun. 3, 1997

[54] HIGH PERFORMANCE FIELD EFFECT TRANSISTOR WITH LAI REGION

[75] Inventor: Gary Hong, Hsin-Chu, Taiwan

[73] Assignee: United Microelectronics Corporation, Hsin-Chu, Taiwan

[21] Appl. No.: 537,138

[22] Filed: Sep. 29, 1995

Related U.S. Application Data

[62] Division of Ser. No. 374,898, Jan. 19, 1995, Pat. No. 5,478,763.

[51] Int. Cl.$^6$ .......................... H01L 29/76; H01L 29/94; H01L 31/062
[52] U.S. Cl. .......................... 257/402; 257/403; 257/412
[58] Field of Search .......................... 257/282, 285, 257/286, 412, 413, 402

[56] References Cited

U.S. PATENT DOCUMENTS

| | | | |
|---|---|---|---|
| 5,079,620 | 1/1992 | Shur | 357/91 |
| 5,244,823 | 9/1993 | Adan | 437/41 |
| 5,268,590 | 12/1993 | Pfiester et al. | 257/412 |
| 5,510,279 | 4/1996 | Chien et al. | 437/41 |

*Primary Examiner*—Wael Fahmy
*Attorney, Agent, or Firm*—William H. Wright

[57] ABSTRACT

A MOSFET transistor device with a gate formed over a lightly doped semiconductor substrate with a gate, and a source region and a drain region. $V_{T1}$ ions are uniformly implanted into the surface of the substrate forming a $V_T$ region with substantially uniform doping in the upper portion of the substrate near the surface thereof. A gate oxide layer is formed on the substrate. A gate conductor is deposited over the gate oxide layer. A large angle implant is implanted into the region of the device over the source region. Then ions are implanted to form the source and drain regions which are self-aligned with the gate.

16 Claims, 4 Drawing Sheets

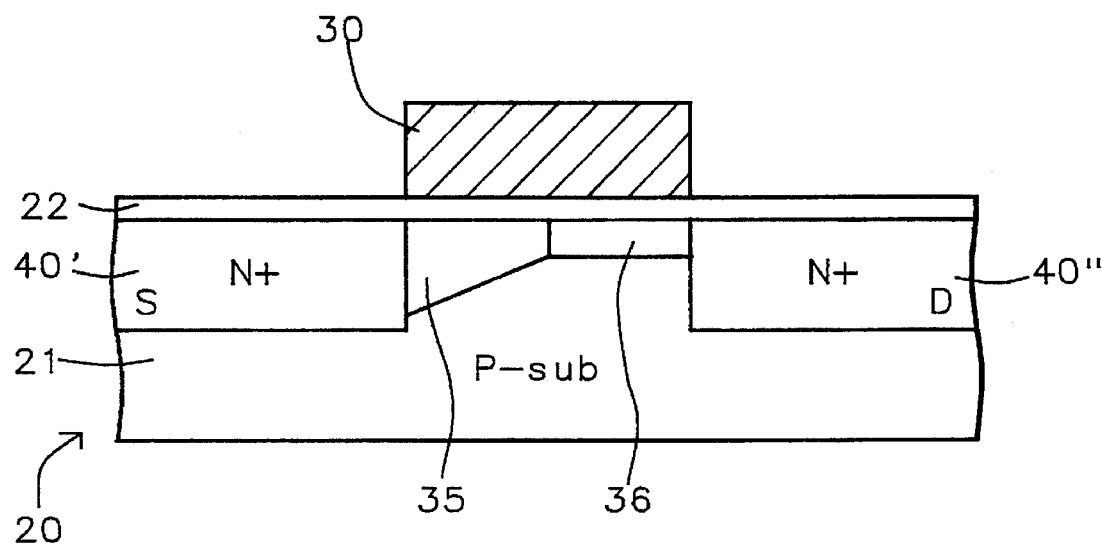
FIG. 1
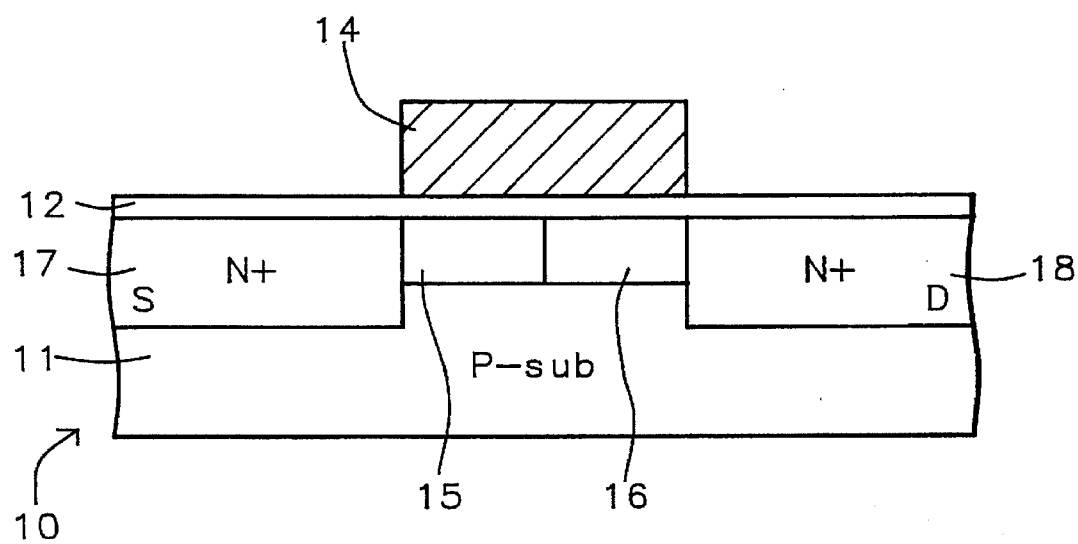
FIG. 2 - Prior Art

HIGH PERFORMANCE FIELD EFFECT TRANSISTOR WITH LAI REGION This is a divisional of application Ser. No. 08/374,898, filed on Jan. 19, 1995 and now U.S. Pat. No. 5,478,763.

BACKGROUND OF THE INVENTION

1. Field of the Invention

This invention relates to semiconductor memories and more particularly to high performance FET transistors and the method of manufacture thereof.

2. Description of Related Art

In the prior art shown U.S. Pat. No. 5,079,620 of Shur for a "Split-Gate Field Effect Transistor," a higher $V_T$ close to the source region means a smaller voltage swing in the source region for a fixed applied gate voltage, which leads to a higher electric field in the channel region close to the source. Under those circumstances, there is a more rapid increase of electron velocity as a function of distance. Hence, the FET has shorter electron transit time in channel conduction, i.e the FET has a higher speed. However, as the dimensions of transistors shrink, it is difficult to separate the doping of a submicron channel (having a width less than one micrometer) into two controllable regions as described in the Shur patent.

In particular a prior art device similar to some degree to the Shur patent (FIG. 2 thereof) is shown in FIG. 2, a transistor 10 is formed starting with a P-substrate 11 which includes N+ source region 17 and N+ drain region 18. Between the N+ source and drain regions 17 and 18 are regions 15 and 16. Region 15 has a higher threshold voltage than region 18, where the channel region is close to the drain region 18. Above the substrate 11 is a gate oxide layer 12. Above the gate oxide layer 12 and the channel is a gate electrode 14 extending between the source and drain regions 17 and 18. The lower left edge of gate 14 is aligned with the right end of N+ source region 17 in substrate 11. The lower right edge of floating gate 14 overlies and is aligned with the left end of N+ drain region 18.

SUMMARY OF THE INVENTION

An object of this invention is a simple manufacturable process for building an FET which has the desired high performance (low electron transit time) characteristics.

In accordance with this invention, a method is provided for fabricating a MOSFET transistor device with a gate formed over a lightly doped semiconductor substrate with a gate, and a source region and a drain region. Provide a uniform $V_{Ti}$ ion implant into the surface of the substrate forming a $V_T$ region with substantially uniform doping in the upper portion of the substrate near the surface thereof. Form a gate oxide layer on the substrate, form a gate conductor over the gate oxide layer, and perform a large angle implant into the region of the device over the source region. Then, ion implant ions to form the source and drain regions which are self-aligned with the gate.

Preferably, the uniform $V_T$ implant region is implanted with boron or $BF_2$ dopant, performed with an initial, substantially uniform dose between about 2E11 cm$^{-2}$ and about 1E12 cm$^{-2}$ with an energy between about 20 keV and about 80 keV. The gate oxide has a thickness between about 200 Å and about 300 Å. The control gate layer comprises polysilicon. The large angle implant into the region of the device over the source region is performed at an angle Θ of between about 20° and about 60° from vertical relative to the surface of the gate oxide layer, implanting boron or $BF_2$ ions with energies between about 50 keV and about 150 keV with a dose between about 2E11 cm$^{-2}$ and about 2E12 cm$^{-2}$. The gate layer comprises a doped polysilicon oxide having thickness between about 2,000 Å and about 5,000 Å. The S/D implant employs implantation of arsenic (As) ions with an energy between about 30 keV and about 100 keV with a dose between about 1E15 cm$^{-2}$ and about 5E15 cm$^{-2}$.

In accordance with another aspect of this invention a method is provided for fabrication of a MOSFET transistor device with a gate formed over a lightly doped semiconductor substrate with a gate, and a source region and a drain region. The method comprises the steps which follow. Provide a uniform $V_{Ti}$ ion implant into the surface of the substrate forming a substantially uniform $V_T$ region in the upper portion of the substrate near the surface the uniform $V_T$ implant region has an implantation of boron or BF2 dopant performed with a dose between about uniform dose between about 2E11 cm$^{-2}$ and about 1E12 cm$^{-2}$ with energies between about 20 keV and about 80 keV. Then, form a gate oxide layer on the substrate having a thickness between about 200 Å and about 300 Å, form a gate conductor over the gate oxide layer comprising a doped polysilicon oxide having thickness between about 2,000 Å and about 5,000 Å, and perform a large angle implant into the region of the device over the source region at an angle Θ of between about 20° and about 60° from vertical relative to the surface of the gate oxide layer. The LAI implants boron or $BF_2$ ions with an energy between about 50 keV and about 150 keV with a dose between about 2E11 cm$^{-2}$ and about 2E12 cm$^{-2}$. Ions are ion implanted to form the source and drain regions which are self-aligned with the gate the S/D implant employing ion implantation of arsenic (As) ions with an energy between about 30 keV and about 100 keV with a dose between about 1E15 cm$^{-2}$ and about 5E15 cm$^{-2}$.

In accordance with this invention, a MOSFET transistor device with a gate formed over a lightly doped semiconductor substrate with a gate, and a source region and a drain region is provided including the following. A uniform $V_T$ region is ion implanted in the upper portion surface of the substrate near the surface thereof. A gate oxide layer is formed on the substrate followed by a gate conductor over the gate oxide layer. There is a large angle implant region in the substrate in the source region; plus ion implanted source and drain regions which are self-aligned with the gate.

Preferably, the uniform $V_T$ implant region has an implanted region of boron or $BF_2$ dopant, performed with an initial, substantially uniform dose between about 2E11 cm$^{-2}$ and about 1E12cm$^{-2}$ with an energy between about 20 keV and about 80 keV. The gate oxide has a thickness between about 200 Å and about 300 Å. The control gate layer comprises polysilicon. The large angle (LAI) implanted regions of the device were performed at an angle Θ of between about 20° and about 60° from vertical relative to the surface of the gate oxide layer. The gate layer comprises a doped polysilicon oxide between about 2,000 Å and about 5,000 Å thick. The S/D regions having been implanted with arsenic (As) ions with an energy between about 30 keV and about 100 keV with a dose between about 1E15 cm$^{-2}$ and about 5E15 cm$^{-2}$. The LAI regions were implanted with boron or $BF_2$ ions with an energy between about 50 keV and about 150 keV with a dose between about 2E11 cm$^{-2}$ and about 2E12 cm$^{-2}$.

In accordance with still another aspect of the invention, a MOSFET transistor device with a gate formed over a lightly doped semiconductor substrate with a gate, and a source region and a drain region in accordance with the following.

A uniformly ion implanted $V_T$ region is formed in the upper portion of the substrate near the surface with a uniform $V_T$ implant region has an implantation of boron or $BF_2$ dopant, performed with an initial, substantially uniform dose between about 2E11 cm$^{-2}$ and about 1E12 cm$^{-2}$ with an energy between about 20 keV and about 80 keV. A gate oxide layer on the substrate having a thickness between about 200 Å and about 300 Å. A gate conductor over the gate oxide layer comprising a doped polysilicon oxide having thickness between about 2,000 Å and about 5,000 Å. A large angle implant region of the device over the source region was performed at an angle Θ of between about 20° and about 60° from vertical relative to the surface of the gate oxide layer, the LAI implanted region of boron or $BF_2$ ions with an energy between about 50 keV and about 150 keV with a dose between about 2E11 cm$^{-2}$ and about 2E12 cm$^{-2}$, and ion implanted into the source and drain regions which are self-aligned with the gate the S/D implant having employed implantation of arsenic (As) ions with an energy between about 30 keV and about 100 keV with a dose between about 1E15 cm$^{-2}$ and about 5E15 cm$^{-2}$.

BRIEF DESCRIPTION OF THE DRAWINGS

The foregoing and other aspects and advantages of this invention are explained and described below with reference to the accompanying drawings, in which:

FIG. 1 shows an EPROM memory device formed in accordance with this invention with a variably doped channel region beneath the gate electrode.

FIG. 2 shows a prior art device with a transistor formed starting with a P-substrate including N+ source region and N+ drain region.

DESCRIPTION OF THE PREFERRED EMBODIMENT

Figure 3A:
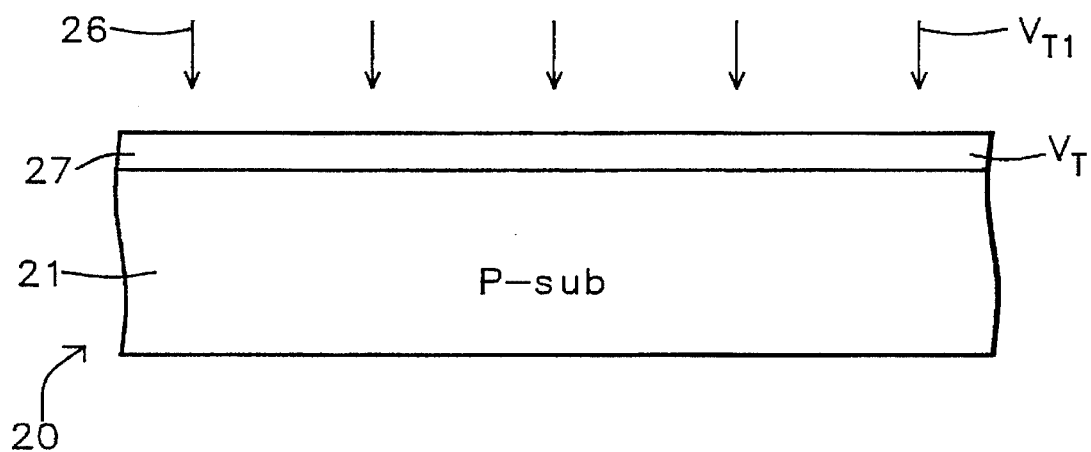
FIGS. 3A–3F show the process flow in accordance with this invention, providing a sequence of cross-sectional illustrations of the process of manufacture of the device of FIG. 1.
Figure 3B:
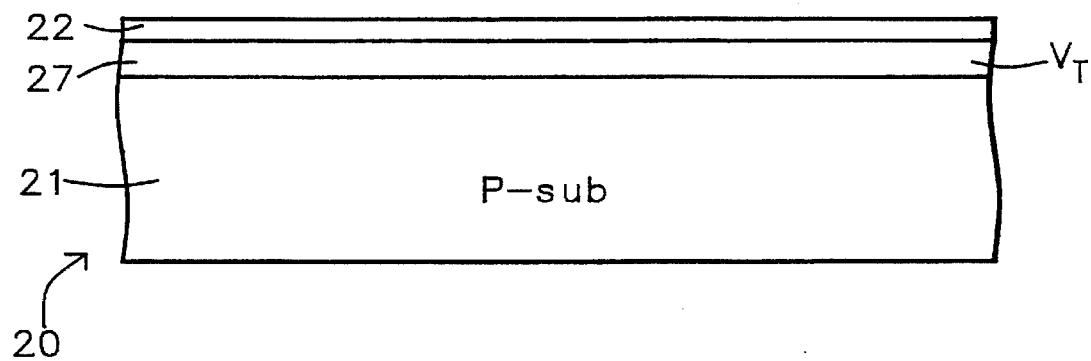

This invention provides a structure and a process sequence for producing an EPROM memory device which is described with reference to FIG. 1 which shows the structure and FIGS. 3A–3K which illustrate a process for making the device of FIG. 1.

FIG. 1 shows an EPROM memory device 20 formed in accordance with this invention with a variably doped channel region beneath a gate electrode 30. Referring to FIG. 1, EPROM memory device 20 is formed on a P-silicon substrate 21 including N+ doped source region 40' on the left and N+ doped drain region 40" on the right in the surface of substrate 21. Substrate 21, including regions 40' and 40", is covered with gate oxide layer 22 upon which is formed a polysilicon gate 30. Below the gate 30 in P-substrate 21 between the N+ doped region 40' and N+ doped source region 40" are non-uniform doped channel region 35 on the left, and uniform doped channel region 36 on the right. There are N+ doped regions 40' on the left and N+ region 40" on the right which define the ends of the channel region 35, 36 of FET device 20. A gate oxide layer 22 overlies the surface of the substrate 21.

The source/drain regions in the surface of substrate 21 include N+ doped source region 40' and N+ doped drain region 40" which are located below the gate oxide layer 22, extending down below the surface into substrate 21. The lower right edge of gate 30 overlies the left end of N+ drain region 40" in substrate 21. The lower left edge of gate 30 overlies the right end of N+ source region 40' in substrate 21.

PROCESS

FIGS. 3A–3F show the process flow in accordance with this invention, providing a sequence of cross-sectional illustrations of the process of manufacture of the device 20 of FIG. 1.

Referring to FIG. 3A, the device 20 is shown in the early stages of fabrication in accordance with the method of this invention, with a P- doped silicon substrate 21 which has been produced by a conventional doping process, etc.

Then, upper surface $V_T$ region 27 is doped by a substantially uniform ion implanting with an initial, substantially uniform $V_{T1}$ dopant 26 such as boron or $BF_2$. The dopant can is applied in a conventional process of ion implantation.

Preferably, ion implantation of boron or $BF_2$ $V_{T1}$ dopant 26 is performed with a dose between about 2E11 cm$^{-2}$ and about 1E12 cm$^{-2}$ with energies between about 20 keV and about 80 keV.

EXAMPLE

Boron dopant 26 is ion implanted with a dose of 5E11 cm$^{-2}$ with an energy of 30 keV.

Gate Oxidation

By the conventional process of gate oxidation the substrate 21, including region 27, is covered with a blanket of a first dielectric layer (silicon dioxide) gate oxide layer 22 having a preferred thickness between about 200 Å and about 300 Å. The conventional process, which is preferably used, comprises growing the gate oxide layer 22 by thermal oxidation in an atmosphere of dry $O_2$ and $N_2$ (for example thermal oxidation is performed at a temperature of about 850° C. for about 30 minutes.)

Gate Deposition and Doping

Figure 3C:
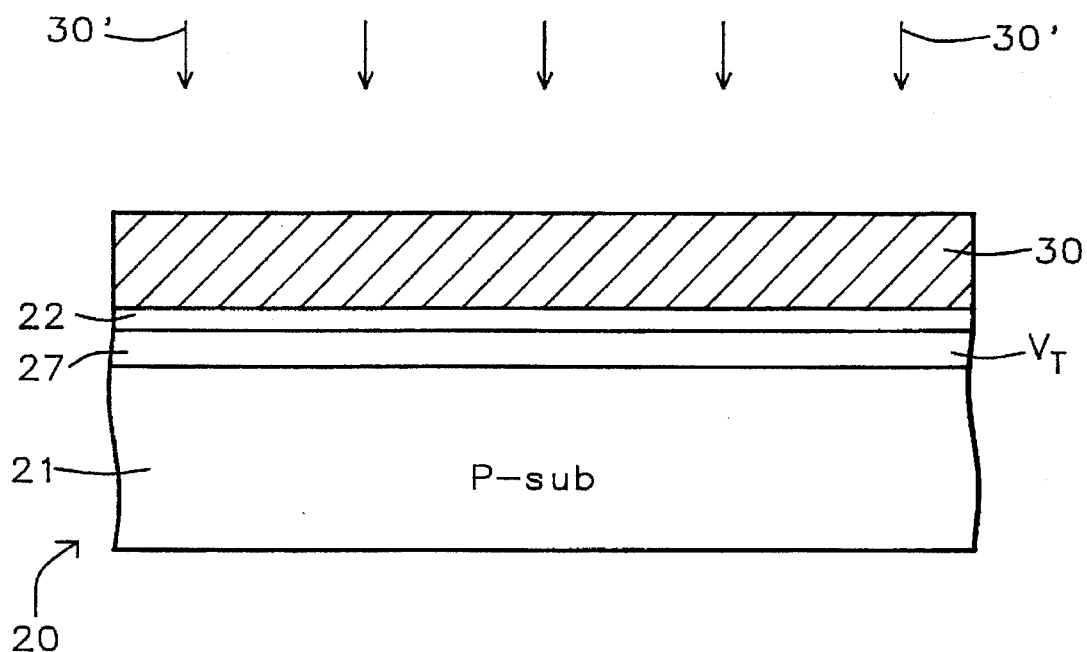

Then, referring to FIGS. 3C, a blanket, gate, polysilicon (or polycide) layer 30 is deposited to a preferred range of thicknesses between about 2,000 Å and about 5,000 Å by the conventional LPCVD (low pressure chemical vapor deposition) process.

Subsequently, the polysilicon 1 layer 30 is doped by a conventional process such as diffusion or ion implantation.

In the case of doping by ion implantation, arsenic (As) ion 37 can be applied with a dose between about $1 \times 10^{15}$/cm$^2$ and about $1 \times 10^{16}$/cm$^2$ with energies between about 30 keV and about 100 keV.

In the case of diffusion of dopant, as an example the process of diffusion of phosphoryl chloride ($POCl_3$) at 900° C. for 20 minutes is appropriate.

Gate Patterning

Figure 3D:
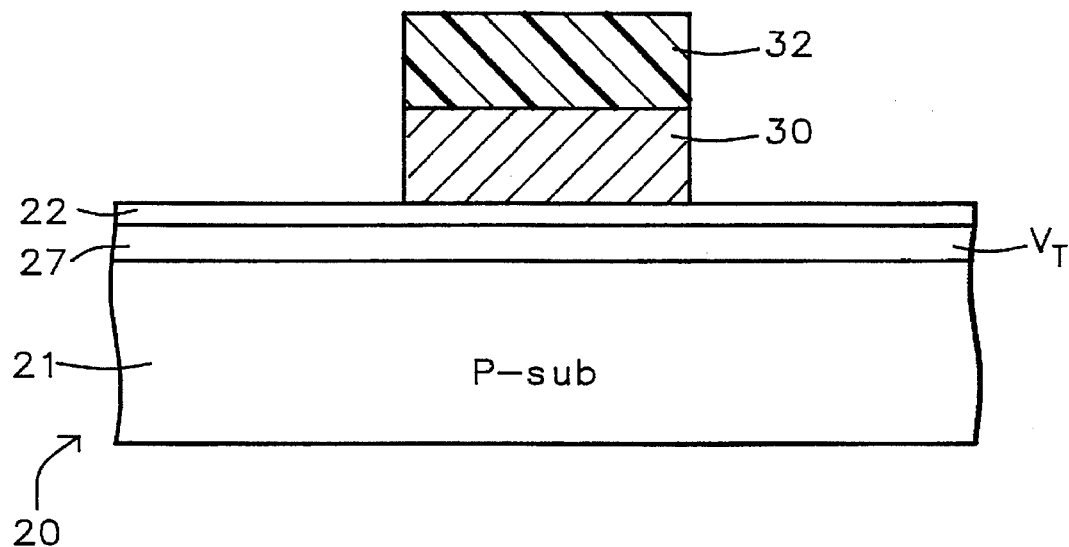

Then, referring to FIG. 3D, the device 20 of FIG. 3C is shown after formation of a photoresist mask 32 for shielding just the portion of gate layer 30 to be formed into the gate 30 (which is shown in FIG. 3D.) The etching step used may be performed as described below.

Etching of Gate

Referring again to FIG. 3D the device 20 is shown after the mask 32 has been used during an etching process in which the gate layer 30 has been etched into the pattern of mask 32 by removing the layer 30 down to gate oxide layer 22 in those areas where the mask 32 has provided no protection. The etching is performed by a conventional process using a dry plasma etch.

Next, the mask 32 is stripped from device 20 leaving the gate 30 on gate oxide layer 22 on substrate 21.

Masking of Drain Side

Figure 3E:
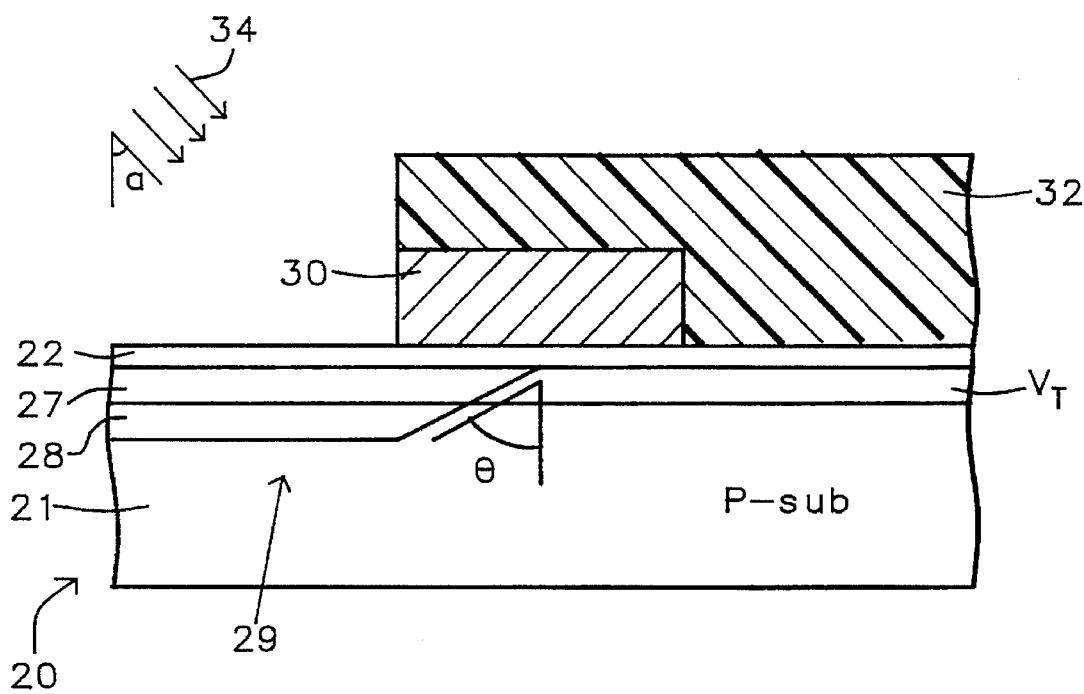

Then, referring to FIG. 3E, the device 20 of FIG. 3D is shown after formation of a photoresist mask 33 for shielding the portion of device 20 where the drain 40" is to be formed and a large portion on the right side of the gate 30.

Large Angle Implant

A conventional large angle implant (LAI) process is performed over what will be the source side of the device 20. The large angle implant is performed at an angle Θ of between about 20° and about 60° from vertical (normal to the surface of gate oxide 22 producing an angled implanted region 29 (shown shaded in FIG. 3E for convenience of illustration) in layer 27 and in region 28 in P-substrate 21.

Preferably, ion implantation of boron or $BF_2$ dopant 34 is performed with a dose between about 2E11 $cm^{-2}$ and about 2E12 $cm^{-2}$ with energies between about 50 keV and about 150 keV.

EXAMPLE

Boron dopant 34 is ion implanted with a dose of 5E11 $cm^{-2}$ with an energy of 80 keV. This LAI implant process together with the use of a polysilicon gate 30 for blocking ions 34 and 40 in a self-aligned method generates a non-uniformity in the $V_T$ region 27 in the channel. The $V_T$ implant dose is higher near the source region 40'.

Figure 3F:
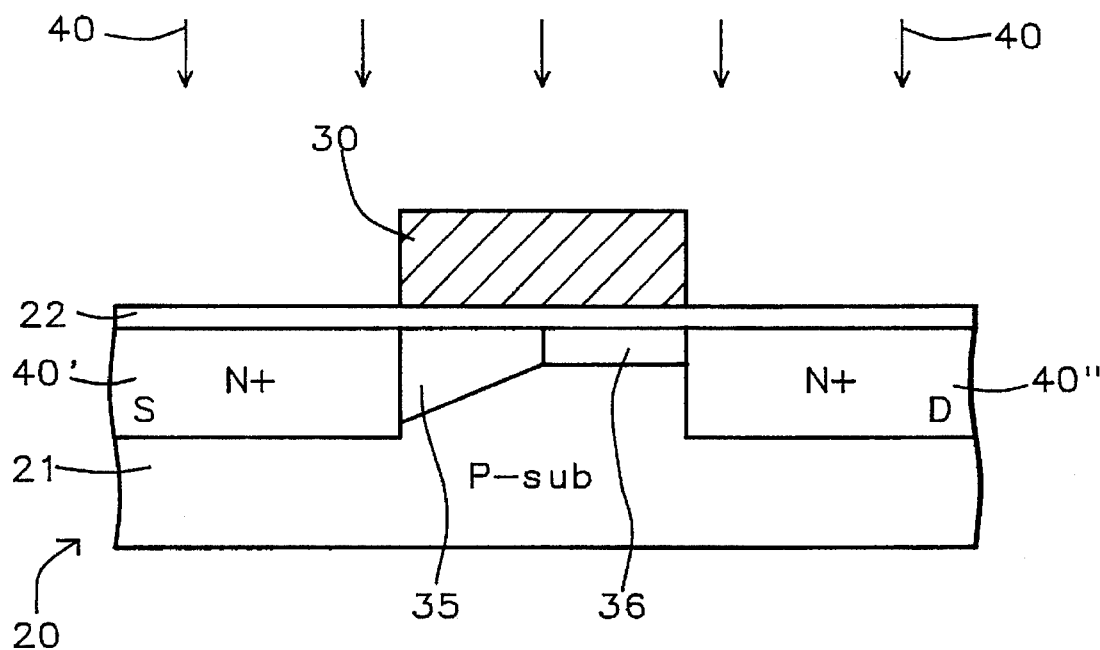

Next, the mask 33 is stripped from the device 20 as seen in FIG. 3F.

N+ Source/Drain Ion Implant

Then referring again to FIG. 3F, the device 20 of FIG. 3E is shown as N+ S/D (source/drain) dopant 40 is being implanted into regions 40', 40" below the exposed surfaces of gate oxide 22 in the P-substrate 21 into region 29 on source side of device 21. The ion implantation of arsenic (As) or phosphorus dopant 40 is performed with a dose between about 1E15 $cm^{-2}$ and about 5E15 $cm^{-2}$ with energies between about 30 keV and about 100 keV.

EXAMPLE

Arsenic (As) ions 40 are ion implanted at an energy of about 50 keV. A dose of As ions 40 of about $3\times10^{15}/cm^2$ is preferred.

Beneath the gate 30, a non-uniform $V_T$ region 35 is shown on the left where the overlapping of the LAI implant ions 34 and the ion implant ions 40 have been implanted. A uniform $V_T$ region 36 is shown on the right where only the ion implant ions 40 have been implanted.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A MOSFET device comprising:

a substrate doped to a first conductivity type;

a uniform $V_T$ region of a uniform depth, doped to a first conductivity type at a higher concentration than said substrate at a surface of said substrate;

a gate oxide layer on said substrate;

a gate over said gate oxide layer;

source and drain regions self-aligned with said gate, said source and drain regions doped to a second conductivity type; and a large angle implant (LAI) region of the first conductivity type in said substrate extending from said source region to a point beneath said gate, a depth of the large angle implant region extending to a first depth adjacent said source and linearly decreasing to a surface of said substrate, said uniform $V_T$ region extending from said large angle implant region to said drain region.

2. A device in accordance with claim 1 wherein said uniform $V_T$ region comprises boron or $BF_2$ dopant, having a concentration like that formed by implanting an initial, substantially uniform dose between about 2E11 $cm^{-2}$ and about 1E12 $cm^{-2}$ with an energy between about 20 keV and about 80 keV.

3. A device in accordance with claim 1 wherein said gate oxide layer has a thickness between about 200 Å and about 300 Å.

4. A device in accordance with claim 3 wherein said gate comprises polysilicon.

5. A device in accordance with claim 1 wherein said large angle (LAI) implanted region of said device was formed at an angle Θ of between about 20° and about 60° from vertical relative to a surface of said gate oxide layer.

6. A device in accordance with claim 1 wherein said gate comprises doped polysilicon having a thickness between about 2,000 Å and about 5,000 Å.

7. A device in accordance with claim 1 wherein said source and drain regions were implanted with arsenic (As) ions with an energy between about 30 keV and about 100 keV with a dose between about 1E15 $cm^{-2}$ and about 5E15 $cm^{-2}$.

8. A device in accordance with claim 7 wherein said LAI region is implanted with boron or $BF_2$ ions with an energy between about 50 keV and about 150 keV with a dose between about 2E11 $cm^{-2}$ and about 2E12 $cm^{-2}$.

9. A device in accordance with claim 1 wherein said large angle implant region formed by implantation at an angle θ of between about 20° and about 60° from vertical relative to a the surface of said gate oxide layer having implanted boron or $BF_2$ dopant ions with an energy between about 50 keV and about 150 keV with a dose between about 2E11 $cm^{-2}$ and about 1E12 $cm^{-2}$.

10. A device in accordance with claim 9 wherein said uniform $V_T$ region has an implantation of boron or $BF_2$ dopant, performed with an initial, substantially uniform dose between about 2E11 $cm^{-2}$ and about 1E12 $cm^{-2}$ with an energy between about 20 keV and about 80 keV.

11. A device in accordance with claim 10 wherein said gate oxide layer has a thickness between about 200 Å and about 300 Å.

12. A device in accordance with claim 11 wherein said gate comprises polysilicon.

13. A device in accordance with claim 12 wherein said large angle implant region formed by implantation at an angle θ of between about 20° and about 60° from vertical relative to the surface of said gate oxide layer.

14. A device in accordance with claim 13 wherein said gate comprises doped polysilicon having a thickness between about 2,000 Å and about 5,000 Å.

15. A device in accordance with claim 14 wherein said source and drain regions were implanted with arsenic (As) ions which were ion implanted with an energy between about 30 keV and about 100 keV with a dose between about 1E15 cm$^{-2}$ and about 5E15 cm$^{-2}$.

16. A device in accordance with claim 15 wherein said LAI region is formed by implantation of boron or BF$_2$ ions with a dose between about 2E11 cm$^{-2}$ and about 2E12 cm$^{-2}$ at an energy between about 50 keV and about 150 keV.

* * * * *